United States Patent
Lin et al.

(10) Patent No.: US 8,351,219 B2
(45) Date of Patent: Jan. 8, 2013

(54) ELECTRONIC ASSEMBLY FOR AN IMAGE SENSING DEVICE

(75) Inventors: Chun-Chi Lin, Hsinchu (TW); Jau-Jan Deng, Taipei (TW); Wei-Ping Chen, Taipei (TW)

(73) Assignees: VisEra Technologies Company Limited, Hsinchu (TW); OmniVision Technologies, Inc., Santa Clara, CA (US)

( * ) Notice: Subject to any disclaimer, the term of this patent is extended or adjusted under 35 U.S.C. 154(b) by 471 days.

(21) Appl. No.: 12/553,362

(22) Filed: Sep. 3, 2009

(65) Prior Publication Data

US 2011/0051390 A1 Mar. 3, 2011

(51) Int. Cl.
*H05K 9/00* (2006.01)
*H05K 7/00* (2006.01)
*H05K 7/10* (2006.01)
*H05K 7/14* (2006.01)
*H01L 33/00* (2010.01)
*H01L 31/0232* (2006.01)
*H01L 27/146* (2006.01)

(52) U.S. Cl. ........ 361/818; 361/760; 361/770; 361/799; 361/816; 257/98; 257/432; 257/435

(58) Field of Classification Search .......... 257/231, 257/432, 738, 98, 435; 361/794, 799, 800, 361/735, 742, 770, 790, 792, 816, 818, 760, 361/809; 348/335
See application file for complete search history.

(56) References Cited

U.S. PATENT DOCUMENTS

| | | | |
|---|---|---|---|
| 5,345,324 A * | 9/1994 | Koseki et al. | 349/44 |
| 2003/0124762 A1* | 7/2003 | Hashimoto | 438/67 |
| 2005/0056769 A1* | 3/2005 | Chen | 250/208.1 |
| 2006/0043886 A1* | 3/2006 | Lee et al. | 313/506 |
| 2006/0044450 A1* | 3/2006 | Wolterink et al. | 348/340 |
| 2006/0202293 A1* | 9/2006 | Bogdan et al. | 257/432 |
| 2006/0226452 A1* | 10/2006 | Yamaguchi | 257/231 |
| 2007/0090478 A1* | 4/2007 | Chen et al. | 257/433 |
| 2007/0216028 A1* | 9/2007 | Lee et al. | 257/738 |
| 2008/0061425 A1* | 3/2008 | Kuan et al. | 257/693 |
| 2008/0164550 A1* | 7/2008 | Chen et al. | 257/432 |
| 2008/0218623 A1* | 9/2008 | Lo et al. | 348/345 |
| 2009/0134483 A1* | 5/2009 | Weng et al. | 257/432 |
| 2009/0256931 A1* | 10/2009 | Lee et al. | 348/231.99 |
| 2009/0321861 A1* | 12/2009 | Oliver et al. | 257/432 |
| 2011/0032409 A1* | 2/2011 | Rossi et al. | 348/340 |
| 2011/0050979 A1* | 3/2011 | Rudmann | 348/335 |

* cited by examiner

*Primary Examiner* — Timothy Thompson
*Assistant Examiner* — Sherman Ng
(74) *Attorney, Agent, or Firm* — Muncy, Geissler, Olds & Lowe, PLLC

(57) ABSTRACT

An electronic assembly for an image sensing device is disclosed, comprising an image sensing element, a lens set comprising a feet enclosing a cavity to receive the image sensing element and an opaque conductive layer disposed on at least a portion of a top side, a sidewall and a bottom side of the lens set, wherein the opaque conductive layer is electrically connected to a grounding layer to reduce electromagnetic interference (EMI) to the image sensing element.

18 Claims, 6 Drawing Sheets

US 8,351,219 B2

ELECTRONIC ASSEMBLY FOR AN IMAGE SENSING DEVICE

BACKGROUND OF THE INVENTION

1. Field of the Invention

The invention relates to image sensor technology and more particularly to a structure of an image sensor device with electromagnetic interference (EMI) shielding.

2. Description of the Related Art

Charge coupled devices (CCD) and complementary metal oxide semiconductor CMOS image sensor devices are widely used in digital imaging applications. Image capture technology is required by consumers due to the proliferation of devices employing image sensor devices, including digital cameras, digital video recorders and image capture capable mobile phones.

Electromagnetic interference (EMI) occurs when a digital camera module is used in a potable electronic device. EMI affects image quality of the digital camera module. Therefore, a new image sensor device structure is required to decrease EMI.

BRIEF SUMMARY OF INVENTION

Thus, an embodiment of the invention provides an electronic assembly for an image sensing device, comprising an image sensing element, a lens set comprising a feet enclosing a cavity to receive the image sensing element and an opaque conductive layer disposed on at least a portion of a top side, a sidewall and a bottom side of the lens set, wherein the opaque conductive layer is electrically connected to a grounding layer to reduce electromagnetic interference (EMI) to the image sensing element.

Another embodiment of the invention provides a wafer-level lens set, comprising at least a substrate, at least a optical surface (spherical or aspheric surface) and a stop aperture on the substrate on the substrate, one of stop aperture, a first spacer on the substrate, a second spacer under the substrate, an opaque conductive layer covering a top side of the first spacer, sidewalls of the first spacer, the substrate and the second spacer, and a bottom side of the second spacer, wherein the second spacer encloses a cavity for receiving an image sensing element, and the opaque conductive layer reduces electromagnetic interference (EMI) to the image sensing element.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
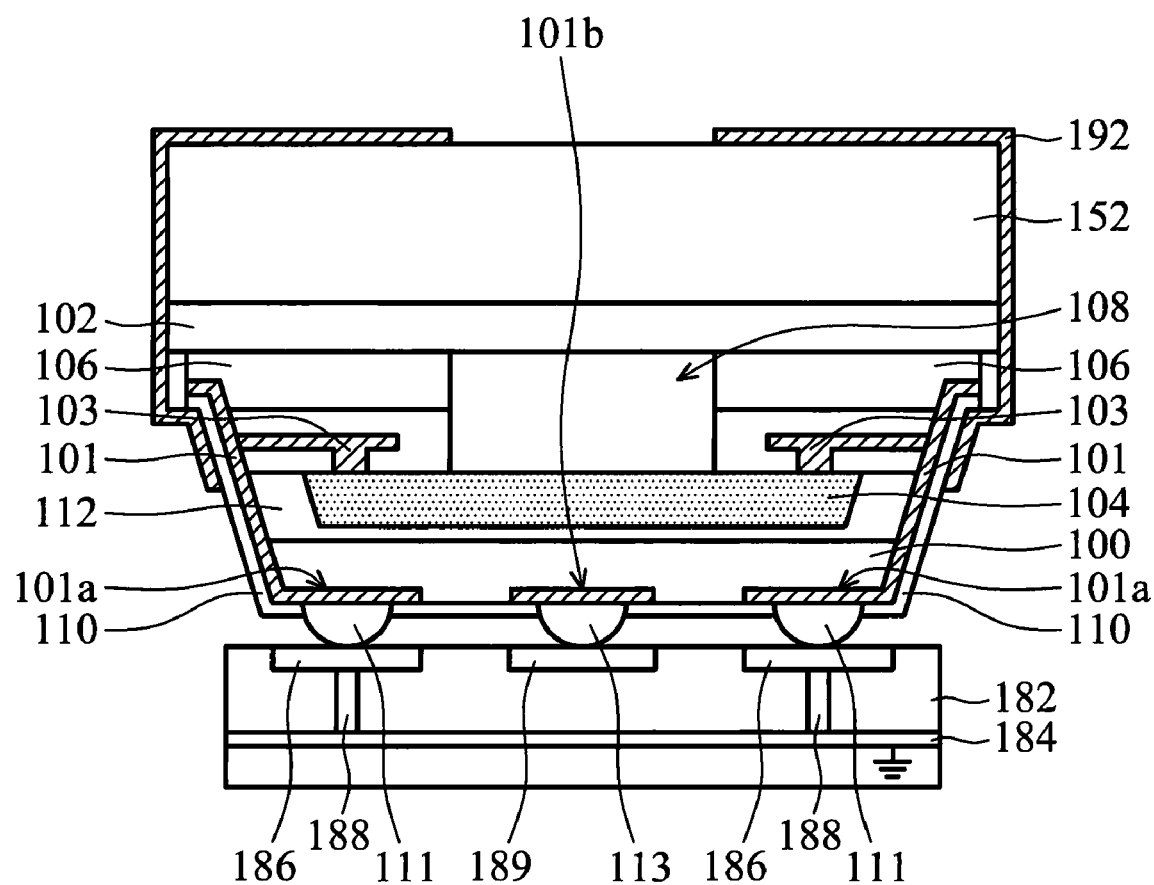
FIG. 1 demonstrates an electronic assembly for an image sensor device.

FIG. 1 is an image sensor device package. Note that the image sensor device package is not prior art for the purposes of determining the patentability of the invention and the image sensor device package is used to merely show deficiencies thereof. As shown in FIG. 1, the electronic assembly comprises an image sensor chip scale package (CSP) module and a lens set 152 sequentially mounted on a printed circuit board (PCB) 182. The CSP module comprises a device chip 104, such as such as a charge-coupled device (CCD) image sensor chip or CMOS image sensor chip, interposed between lower and upper substrates 100 and 102 comprising glass, quartz or other transparent material. The device chip 104 is adhered to the lower substrate 100 via an epoxy layer 112 and is adhered to the upper substrate 102 via a spacer (or dam) 106 forming a cavity 108 therebetween. A micro-lens array (not shown) is formed on the device chip 104 in the cavity 108. A conductive layer 101 is disposed along the sidewall and the bottom of the lower substrate 100. Typically, the conductive layer 101 on the bottom of the lower substrate 100 is patterned to form grounding pads of the CSP module and signal pads. In order to simplify the diagram, only two grounding pads 101a of the CSP module and one signal pad 101b are depicted. The conductive layer 101 over the sidewall of the lower substrate 100 laterally contact grounding pads 103 of the device chip 104 to electrically connect to the grounding pads 101a of the CSP module and grounding pads 103 of the device chip 104. A protective layer 110 covers the conductive layer 101. The protective layer 110 at the bottom of the lower substrate 100 is patterned to expose the pads 101a and 101b. Solder balls 111 and 113 are respectively disposed on the corresponding pads 101a and 101b.

A lens set 152 comprising a stack of multiple lenses (not shown) is mounted on the CSP module to form a compact camera module (CCM). The CCM is mounted on the PCB 182 via solder balls 111 and 113. The solder balls 111 are electrically connected to a grounding layer 184 inside the PCB 182 through grounding pads 186 of the PCB 182 and plugs 188 thereunder. The solder ball 113 is electrically connected to the circuits (not shown) on the PCB 182 through a pad 189. In order to suppress EMI, an opaque conductive layer 192 covers the CCM and is electrically connected to the grounding layer 184 through the conductive layer 101, the grounding pads 186 of the PCB 182 and plugs 188 thereunder. The electronic assembly described, however, due to the assembly structure and method thereof, can only used for sensor chip scale package (CSP) module. A novel assembly which can be used for other package structures, such as chip on board (COB) or ceramic leaded chip carrier (CLCC) package structures is required to provide more flexible application of image sensing devices.

Figure 2A:
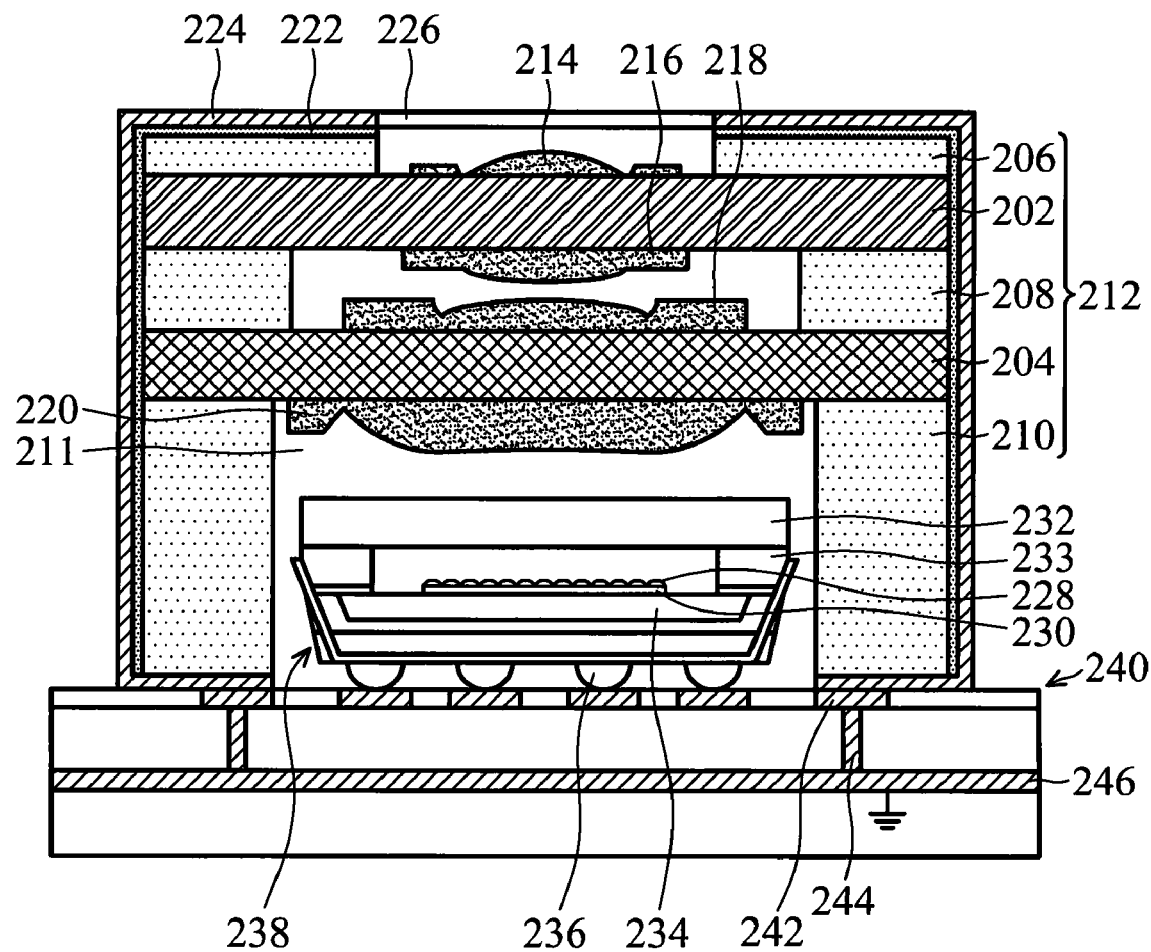
FIG. 2A shows an electronic assembly for an image sensing device of an embodiment of the invention.

FIG. 2A shows an electronic assembly for an image sensing device of an embodiment of the invention. Referring to FIG. 2A, a lens set 212 is provided. The lens set 212 in the embodiment is a wafer-level lens cube formed by wafer-level optics technology, including a first substrate 202 with a first surface 214 and a second surface 216 on opposite sides thereof and a second substrate 204 with a third surface 218 and a fourth surface 220 on opposite sides thereof. Note that the invention is not limited to the lens set including four surfaces and two substrates shown in the FIG. 2A. Any other kind of wafer-level lens set including at least one surface can be used in the application. For example, the lens set can be single-sided lens or double-sided lens with a least one aperture. As shown in FIG. 2A, a first spacer 206 is disposed on the first substrate 202, a second spacer 208 is interposed between the first substrate 202 and the second substrate 204, and a third spacer 210 is disposed under the second substrate 204. Note that the third spacer 210 acts as a feet to enclose a cavity 211 for receiving an assembled image sensing device package 238. The assembled an image sensing device package 238 can comprise a substrate 234, a photoelectric element array 230, a micro lens array 228, a covering substrate 232, a spacer 233 for supporting the covering substrate 232 and a plurality of solder balls 236 under the substrate 234. In order to suppress stray light from illuminating onto the assembled image sensing device, a black coating layer 222, such as black photoresist, is formed on a top side, a sidewall and a bottom side of the lens set 212. In order to suppress EMI from the assembled image sensing device, an opaque conductive layer 224 is formed on the top side, the sidewall and the bottom side of the lens set 212 and over the black coating layer 222. Specifically, the opaque conductive layer 224 covers a top side of the first spacer 206, sidewalls of the first spacer 206, the first substrate 202, the second spacer 208, the second substrate 204 and the third spacer 210, and the bottom side of the third spacer 210. The opaque conductive layer 224 can be aluminum, copper, nickel, silver or stainless steel in the embodiment, which is connected to pads 242 of a printed circuit board (PCB) 240 and is electrically connected to a grounding layer 246 through the pads 242 and plugs 244 in a printed circuit board 240 to provide ground shielding. In addition, the solder balls 236 of the assembled image sensing device package 238 are electrically connected to the pads 242 of the printed circuit board. In order to achieve passage of light through the lens set 212, a transparent conductive layer 226, such as indium tin oxide (ITO), is formed on a portion of the top side of the lens set 212. Due to the opaque conductive layer 224 connected to a grounding layer 246, the assembled image sensing device of the embodiment of the invention can eliminate EMI from the assembled an image sensing device.

Figure 2B:
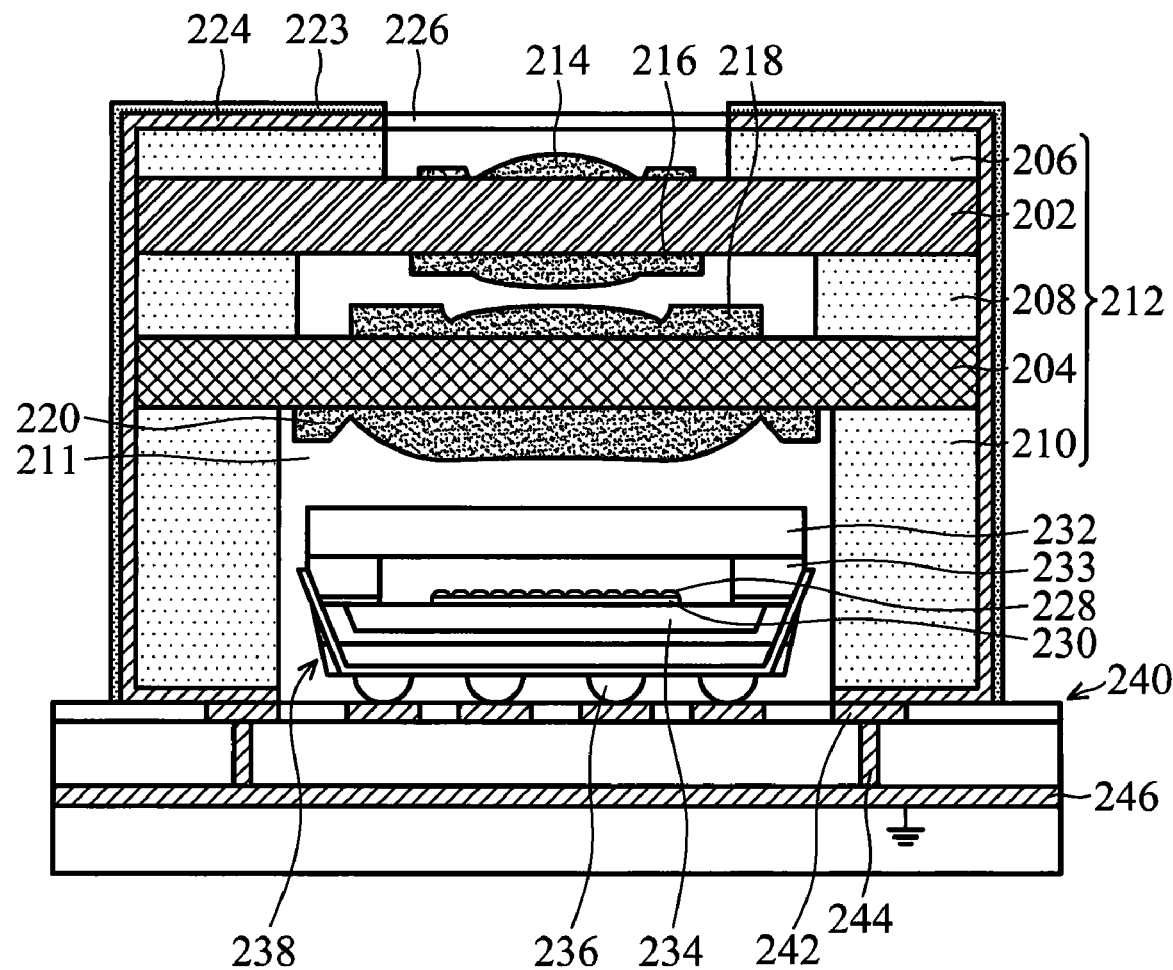
FIG. 2B shows another electronic assembly for an image sensing device of an embodiment of the invention

Alternatively, the black coating layer is not limited to be between the opaque conductive layer and the lens set in the invention, but as shown in FIG. 2B, which shows an electronic assembly for an image sensing device of another embodiment, the black coating layer 223 can also be formed on a outer surface of the opaque conductive layer 224.

Figure 3:
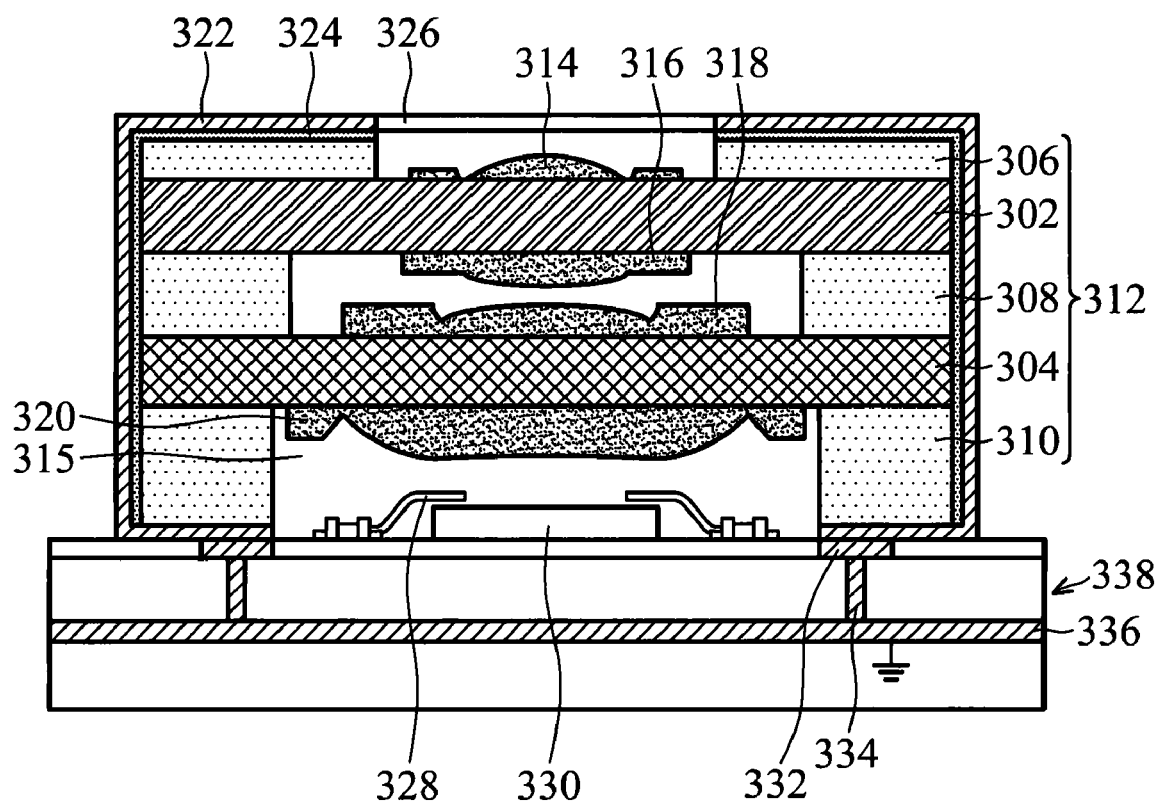
FIG. 3 shows further electronic assembly for an image sensing device of an embodiment of the invention.

FIG. 3 shows an electronic assembly for an image sensing device of another embodiment of the invention. Unlike the embodiment shown in FIG. 2, the image sensing device is packaged as a chip on board (COB) structure in the embodiment. Referring to FIG. 3, a lens set 312 is provided. The lens set 312 in the embodiment is formed by wafer-level optics technology, including a first substrate 302 with a first surface 314 and a second surface 316 on opposite sides thereof and a second substrate 304 with a third surface 318 and a fourth surface 320 on opposite sides thereof. Note that the invention is not limited to the lens set 312 including four surfaces and two substrates shown in the FIG. 3. Any other kind of wafer-level lens set including at least one surface can be used in the application. For example, the lens set can be single-sided lens or double-sided lens with a least one aperture. As shown in FIG. 3, a first spacer 306 is disposed on the first substrate 302, a second spacer 308 is interposed between the first substrate 302 and the second substrate 304, and a third spacer 310 is disposed under the second substrate 304. Note that the third spacer 310 acts as a feet to enclose a cavity 315 for receiving an image sensing chip 330. The image sensing chip 330 is attached to a printed circuit board (PCB) 338 to form a chip on board package structure (COB). A conductive wire 328 is connected to a pad (not shown) on the image sensing chip and a pad on the printed circuit board 338 to provide electrical connection therebetween. In order to suppress stray light affection to the image sensing chip, a black coating layer 324, such as black photoresist, is formed on a top side, a sidewall and a bottom side of the lens set 312. In order to suppress EMI from the image sensing chip 330, an opaque conductive layer 322 is formed on the top side, the sidewall and the bottom side of the lens set 312. The opaque conductive layer 322 can be aluminum, copper, nickel, silver or stainless steel in the embodiment. The opaque conductive layer 322 is connected to pads 332 of a printed circuit board (PCB) 338 and is electrically connected to a grounding layer 336 through the pads 332 and plugs 334 in a printed circuit board (PCB) 338 to provide ground shielding. In order to achieve passage of light to through the lens set 312, a transparent conductive layer 326, such as indium tin oxide (ITO), is formed on a portion of the top side of the lens set 312. Due to the opaque conductive layer 322 connected to a grounding layer 336, the assembled image sensing device of the embodiment of the invention can eliminate EMI from the assembled image sensing device.

Figure 4:
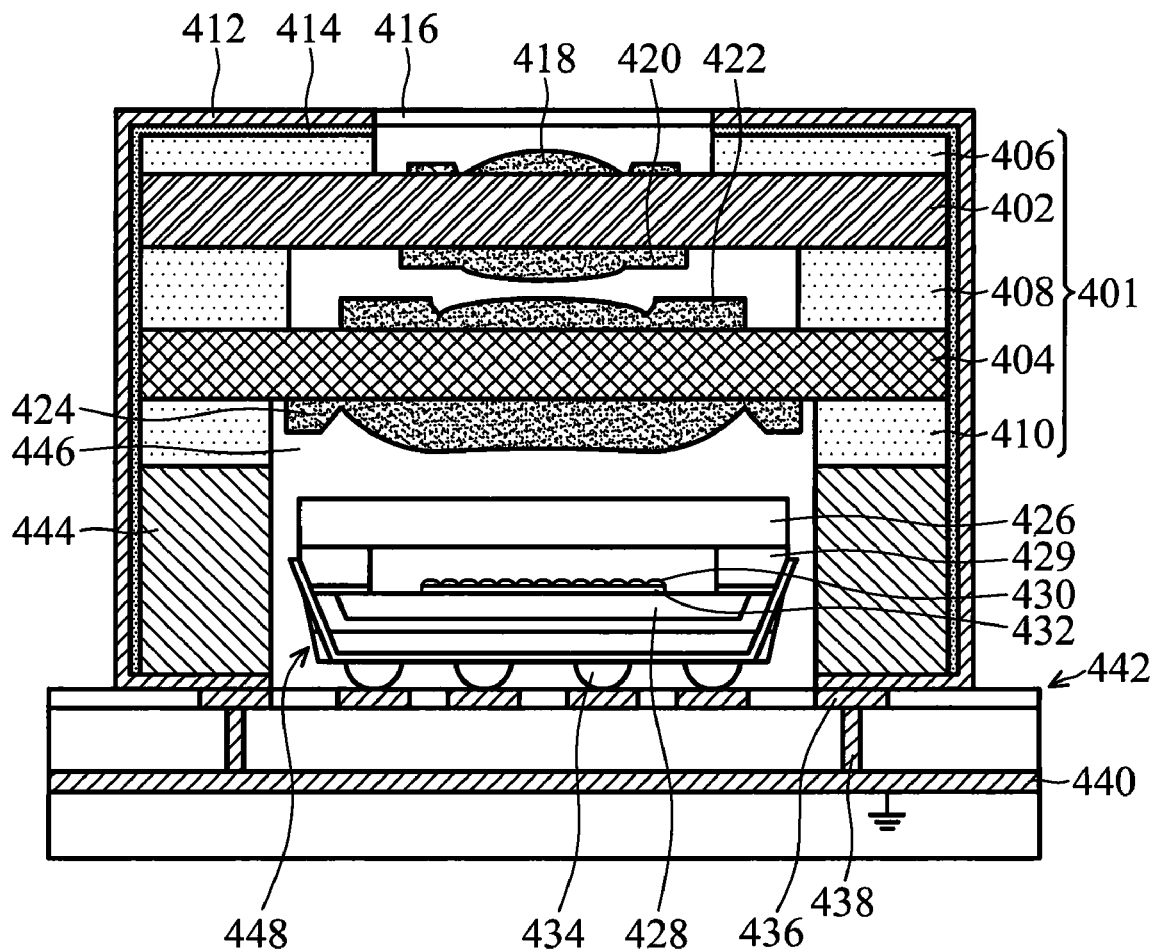
FIG. 4 shows yet another electronic assembly for an image sensing device of an embodiment of the invention.

FIG. 4 shows an electronic assembly for an image sensing device of further another embodiment of the invention. Unlike the embodiments shown in FIG. 2 and FIG. 3, a conductive feet is attached to the lens set in the embodiment. Referring to FIG. 4, a lens set 401 is provided. The lens set 401 in the embodiment is formed by wafer-level optics technology, including a first substrate 402 with a first surface 418 and a second surface 420 on opposite sides thereof and a second substrate 408 with a third surface 422 and a fourth surface 424 on opposite sides thereof. Note that the invention is not limited to the lens set including four surfaces and two substrates shown in the FIG. 4. Any other kind of wafer-level lens set including at least one surface can be used in the application. For example, the lens set can be single-sided lens or double-sided lens with a least one aperture. As shown in FIG. 4, a first spacer 406 is disposed on the first substrate 402, a second spacer 408 is interposed between the first substrate 402 and the second substrate 404, and a third spacer 410 is disposed under the second substrate 404. In an important feature of the embodiment, a conductive feet 444 is bonded to the third spacer 410 of the lens set 401 to enclose a cavity 446 for receiving an assembled image sensing device package 448. The conductive feet 444 can be formed of metal with compatible thermal expansion coefficient (CTE) to the lens set 401. The assembled image sensing device package 446 can comprise a substrate 408, a photoelectric element array 432, a micro lens array 430, a covering substrate 426, a spacer 429 for supporting the covering substrate 426, and a plurality of solder balls 434 under the substrate 428. In order to suppress stray light affection to the assembled image sensing device, a black coating layer 414, such as black photoresist, is formed on a top side and a sidewall of the lens set 401. In order to suppress EMI from effecting the assembled image sensing device, an opaque conductive layer 412 is formed on the top side and the sidewall of the lens set 401, and the bottom side of the conductive feet 444. The opaque conductive layer 412 can be aluminum, copper, nickel, silver or stainless steel in the embodiment. The opaque conductive layer 412 is connected to pads 436 of a printed circuit board (PCB) 442 and is electrically connected to a grounding layer 440 through the pads 436 and plugs 438 in a printed circuit board (PCB) 442 to provide ground shielding. In addition, the solder balls 434 of the assembled image sensing device package 448 are electrically connected to the pads 436 of the printed circuit board 442. In order to achieve passage of light through the lens set 401, a transparent conductive layer 416, such as indium tin oxide (ITO), is formed on a portion of the top side of the lens set 401. Due to the opaque conductive layer 412 connected to a grounding layer 440, the assembled image sensing device of the embodiment of the invention can eliminate EMI from the assembled image sensing device. Further, since the feet 444 enclosing the cavity 446 for receiving the CSP 448 is conductive, the opaque conductive layer 412 can more reliably be connected to the pad 436 to provide ground shielding to eliminate EMI.

Figure 5:
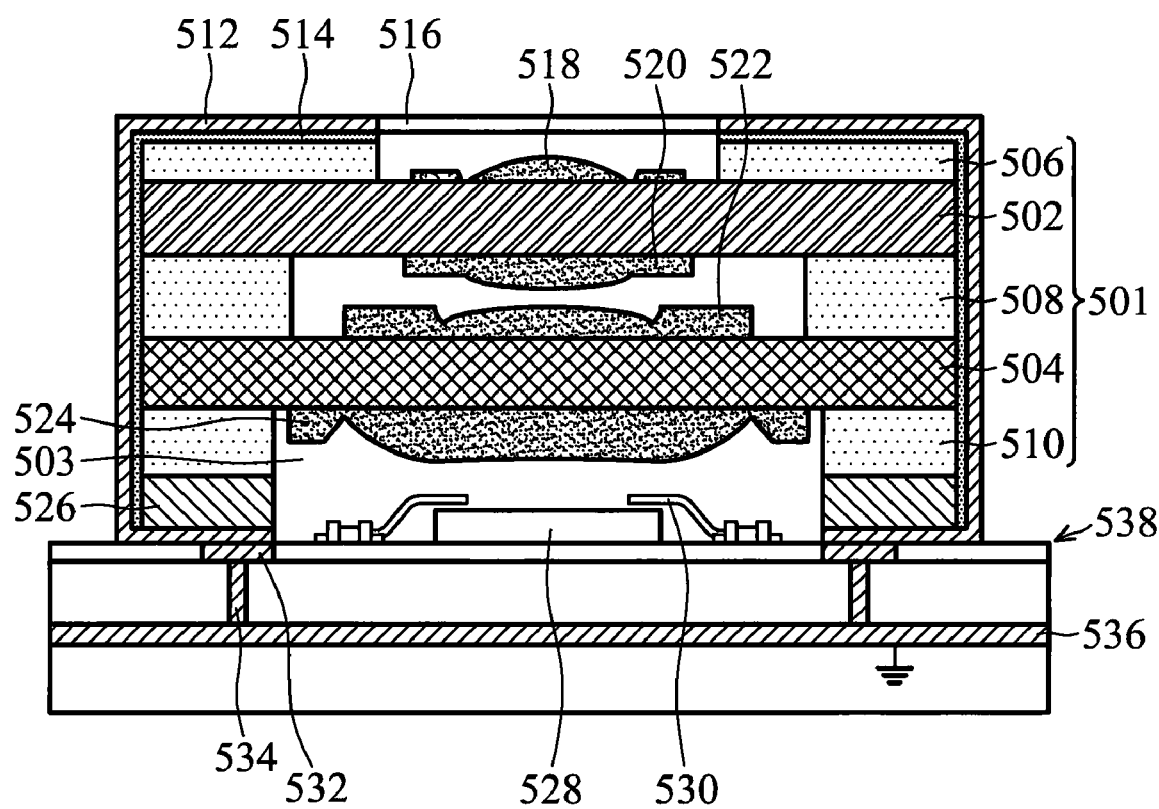
FIG. 5 shows yet further another electronic assembly for an image sensing device of an embodiment of the invention.

FIG. 5 shows an electronic assembly for an image sensing device of yet another embodiment of the invention. Unlike the embodiments described, a conductive feet is attached to the lens set and the image sensing device is packaged as a chip on board (COB) structure in the embodiment. Referring to FIG. 5, a lens set 501 is provided. The lens set 501 in the embodiment is formed by wafer-level optics technology, and includes a first substrate 502 with a first surface 518 and a second surface 520 on opposite sides thereof and a second substrate 504 with a third surface 522 and a fourth surface 524 on opposite sides thereof. Note that the invention is not limited to the lens set including four surfaces and two substrates shown in the FIG. 5. Any other kind of wafer-level lens set including at least one surface can be used in the application. For example, the lens set can be single-sided lens or double-sided lens with a least one aperture. As shown in FIG. 5, a first spacer 506 is disposed on the first substrate 502, a second spacer 508 is interposed between the first substrate 502 and the second substrate 504, and a third spacer 510 is disposed under the second substrate 504. In an important feature of the embodiment, a conductive feet 526 is bonded to the third spacer 510 of the lens set 501, and the conductive feet 526 encloses a cavity 503 for receiving an image sensing chip 528. The conductive feet 526 can be formed of metal with compatible thermal expansion coefficient (CTE) to the lens set 501. The image sensing chip 528 is bonded to a printed circuit board (PCB) 538 to form a chip on board package structure (COB). A conductive wire 530 is connected to a pad (not shown) on the image sensing chip and a pad on the printed circuit board 538 to provide electrical connection therebetween. In order to suppress stray light affection to the image sensing chip, a black coating layer 514, such as black photoresist, is formed on a top side and a sidewall of the lens set 501. In order to suppress EMI from illuminating onto the image sensing chip, an opaque conductive layer 512 is formed on the top side and the sidewall of the lens set 501, and the bottom side of the conductive feet 526. The opaque conductive layer 512 can be aluminum, copper, nickel, silver or stainless steel in the embodiment and is connected to pads 532 of a printed circuit board (PCB), and electrically connected to a grounding layer 536 through the pads 532 and plugs 534 in a printed circuit board (PCB) to provide ground shielding. In order to achieve passage of light through the lens set, 501 a transparent conductive layer 516, such as indium tin oxide (ITO), is formed on a portion of the top side of the lens set 501. Due to the opaque conductive layer 512 connected to a grounding layer 536, the assembled image sensing device of the embodiment of the invention can eliminate EMI from the assembled image sensing device.

According to the invention, since a cavity is formed to receive an image sensing package structure or an image sensing chip, the opaque conductive layer on the lens set can be connected to the pad of the PCB to provide ground shielding regardless of the chip packaging methods used, including a chip scale package (CSP), a ceramic leaded chip carrier (CLCC) or chip on board (COB). Therefore, the invention can provide more flexible application of image sensing devices.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic assembly for an image sensing device, comprising: a lens set comprising a feet enclosing a cavity; an image sensing element disposed in the cavity; an opaque conductive layer disposed on at least a portion of a top side, a sidewall and a bottom side of the lens set; and a black coating layer between the opaque conductive layer and the lens set, wherein the opaque conductive layer is electrically connected to a grounding layer to reduce electromagnetic interference (EMI) to the image sensing element.

2. The electronic assembly for an image sensing device as claimed in claim 1, wherein the image sensing element is a chip scale package structure.

3. The electronic assembly for an image sensing device as claimed in claim 1, wherein the image sensing element is a chip on board package structure.

4. The electronic assembly for an image sensing device as claimed in claim 1, wherein the image sensing element is a ceramic leaded chip carrier (CLCC).

5. The electronic assembly for an image sensing device as claimed in claim 1, wherein the lens set is a wafer-level lens cube.

6. The electronic assembly for an image sensing device as claimed in claim 1, wherein the feet is a spacer at the bottom side of the lens set or a conductive feet connected to the lens set.

7. The electronic assembly for an image sensing device as claimed in claim 6, wherein the conductive feet is formed of metal with a compatible thermal expansion coefficient (CTE) to the lens set.

8. The electronic assembly for an image sensing device as claimed in claim 1, wherein the opaque conductive layer comprises aluminum, copper, nickel, silver or stainless steel.

9. The electronic assembly for an image sensing device as claimed in claim 1, further comprising a transparent conductive layer disposed on a portion of the top side of the lens set for passage of light through the lens set.

10. The electronic assembly for an image sensing device as claimed in claim 9, wherein the transparent conductive layer comprises indium tin oxide (ITO).

11. The electronic assembly for an image sensing device as claimed in claim 1, wherein the black coating layer is a black photoresist.

12. The electronic assembly for an image sensing device as claimed in claim 1, wherein the grounding layer is disposed in a printed circuit board and the opaque conductive layer is electrically connected to the grounding layer through a pad and a plug of the printed circuit board.

13. A wafer-level lens set, comprising: a substrate; a optical surface and stop aperture on the substrate; a first spacer on the substrate; a second spacer under the substrate; an opaque conductive layer covering a top side of the first spacer, sidewalls of the first spacer, sidewalls of the second spacer, and a bottom side of the second spacer; and a black coating layer between the opaque conductive layer and the substrate, the first spacer and the second spacer, wherein the second spacer encloses a cavity and an image sensing element is disposed in the cavity, and the opaque conductive layer reduces electromagnetic interference (EMI) to the image sensing element.

14. The wafer-level lens set as claimed in claim 13, wherein the image sensing element is a chip scale package structure.

15. The wafer-level lens set as claimed in claim 13, wherein the image sensing element is a chip on board package structure.

16. The wafer-level lens set as claimed in claim 13, wherein the image sensing element is a ceramic leaded chip carrier (CLCC).

17. The wafer-level lens set as claimed in claim 13, wherein a portion of the second spacer is a conductive spacer.

18. The wafer-level lens set as claimed in claim 13, wherein the opaque conductive layer is bonded to a pad of a printed circuit board.

* * * * *